(12) United States Patent
Kinsley et al.

(10) Patent No.: US 11,488,938 B2
(45) Date of Patent: *Nov. 1, 2022

(54) SEMICONDUCTOR PACKAGES WITH PASS-THROUGH CLOCK TRACES AND ASSOCIATED SYSTEMS AND METHODS

(71) Applicant: Micron Technology, Inc., Boise, ID (US)

(72) Inventors: Thomas H. Kinsley, Boise, ID (US); George E. Pax, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/219,821

(22) Filed: Mar. 31, 2021

(65) Prior Publication Data

US 2021/0217737 A1    Jul. 15, 2021

Related U.S. Application Data

(63) Continuation of application No. 16/512,591, filed on Jul. 16, 2019, now Pat. No. 10,978,426.

(Continued)

(51) Int. Cl.
*H01L 25/065* (2006.01)
*H01L 23/48* (2006.01)
(Continued)

(52) U.S. Cl.
CPC ........ *H01L 25/0657* (2013.01); *H01L 23/481* (2013.01); *H01L 23/49838* (2013.01); *H01L 24/48* (2013.01); *H01L 2924/1436* (2013.01)

(58) Field of Classification Search
CPC ..... H01L 25/0657; H01L 24/48; H01L 24/02; H01L 24/06; H01L 24/49; H01L 24/73;
(Continued)

(56) References Cited

U.S. PATENT DOCUMENTS

| 5,438,224 A  * | 8/1995  | Papageorge | ...... H01L 23/49575 257/723 |
| 6,303,981 B1 * | 10/2001 | Moden | ................ H01L 23/4951 257/784 |

(Continued)

FOREIGN PATENT DOCUMENTS

| CN | 107437540 A | * | 12/2017 |
| CN | 107437540 A | | 12/2017 |

*Primary Examiner* — Earl N Taylor
(74) *Attorney, Agent, or Firm* — Perkins Coie LLP

(57) ABSTRACT

Semiconductor packages with pass-through clock traces and associated devices, systems, and methods are disclosed herein. In one embodiment, a semiconductor device includes a package substrate including a first surface having a plurality of substrate contacts, a first semiconductor die having a lower surface attached to the first surface of the package substrate, and a second semiconductor die stacked on top of the first semiconductor die. The first semiconductor die includes an upper surface including a first conductive contact, and the second semiconductor die includes a second conductive contact. A first electrical connector electrically couples a first one of the plurality of substrate contacts to the first and second conductive contacts, and a second electrical connector electrically couples a second one of the plurality of substrate contacts to the first and second conductive contacts.

20 Claims, 6 Drawing Sheets

Related U.S. Application Data

(60) Provisional application No. 62/787,012, filed on Dec. 31, 2018.

(51) Int. Cl.
*H01L 23/00* (2006.01)
*H01L 23/498* (2006.01)

(58) Field of Classification Search
CPC ........... H01L 23/5385; H01L 23/49838; H01L 23/481; H01L 2924/1436; H01L 23/49816; H01L 23/49894; H01L 24/05; H01L 24/08; H01L 24/13; H01L 24/16; H01L 24/97; H01L 2224/023; H01L 2224/0237; H01L 2224/0401; H01L 2224/04042; H01L 2224/061; H01L 2224/08225; H01L 2224/131; H01L 2224/45099; H01L 2224/85411; H01L 2224/85439; H01L 2224/97; H01L 2224/16145; H01L 2224/48227; H01L 2224/4912; H01L 2224/73207; H01L 2224/73251; H01L 2224/85447; H01L 2224/85455; H01L 2224/8559; H01L 2224/856; H01L 2225/0651; H01L 2225/06527; H01L 2225/06565; H01L 2924/15183; H01L 2924/15311; G11C 5/04; H05K 1/0243
See application file for complete search history.

(56) References Cited

U.S. PATENT DOCUMENTS

| | | | | |
|---|---|---|---|---|
| 6,555,917 B1* | 4/2003 | Heo | | H01L 23/3128 |
| | | | | 257/777 |
| 6,828,686 B2* | 12/2004 | Park | | H01L 24/03 |
| | | | | 257/784 |
| 6,955,941 B2* | 10/2005 | Bolken | | H01L 23/4952 |
| | | | | 257/E23.033 |
| 7,071,421 B2* | 7/2006 | Heng | | H01L 24/48 |
| | | | | 257/784 |
| 7,119,427 B2* | 10/2006 | Kim | | H01L 23/5387 |
| | | | | 257/784 |
| 7,413,979 B2* | 8/2008 | Rigg | | H01L 23/481 |
| | | | | 257/E21.597 |
| 7,557,454 B2* | 7/2009 | Bolken | | H01L 23/4951 |
| | | | | 257/784 |
| 7,791,175 B2* | 9/2010 | Pyeon | | H01L 21/76898 |
| | | | | 257/621 |
| 7,807,505 B2* | 10/2010 | Farnworth | | H01L 24/97 |
| | | | | 257/E23.129 |
| 7,910,385 B2* | 3/2011 | Kweon | | H01L 25/105 |
| | | | | 438/18 |
| 8,148,807 B2* | 4/2012 | Lee | | H01L 25/50 |
| | | | | 257/723 |
| 8,269,352 B2* | 9/2012 | Wang | | H01L 25/0657 |
| | | | | 257/784 |
| 8,384,200 B2* | 2/2013 | Seng | | H01L 21/44 |
| | | | | 257/777 |
| 9,165,888 B2* | 10/2015 | Fay | | H01L 24/73 |
| 9,432,298 B1* | 8/2016 | Smith | | H04L 47/34 |
| 9,502,369 B2* | 11/2016 | Veches | | H01L 24/48 |
| 9,601,374 B2* | 3/2017 | Fay | | H01L 25/50 |
| 9,831,155 B2* | 11/2017 | Lin | | H01L 24/00 |
| 9,886,343 B2* | 2/2018 | Casper | | G06F 11/1076 |
| 10,115,708 B2* | 10/2018 | Eom | | H01L 24/06 |
| 10,978,426 B2* | 4/2021 | Kinsley | | H01L 23/481 |
| 2002/0180025 A1* | 12/2002 | Miyata | | H01L 25/0657 |
| | | | | 257/E29.022 |
| 2005/0045378 A1* | 3/2005 | Heng | | H01L 25/0657 |
| | | | | 257/784 |
| 2006/0013256 A1 | 1/2006 | Lee et al. | | |
| 2007/0194415 A1* | 8/2007 | Seng | | H01L 24/48 |
| | | | | 257/737 |
| 2007/0222050 A1* | 9/2007 | Lee | | H01L 24/02 |
| | | | | 257/E23.011 |
| 2007/0290333 A1* | 12/2007 | Saini | | G11C 5/02 |
| | | | | 257/723 |
| 2008/0237881 A1* | 10/2008 | Dambrauskas | | H01L 24/05 |
| | | | | 257/E21.597 |
| 2009/0278244 A1* | 11/2009 | Dunne | | H01L 24/33 |
| | | | | 257/676 |
| 2009/0283898 A1* | 11/2009 | Janzen | | H01L 25/0657 |
| | | | | 257/E21.597 |
| 2009/0302484 A1* | 12/2009 | Lee | | H01L 24/29 |
| | | | | 257/E23.141 |
| 2011/0156232 A1* | 6/2011 | Youn | | H01L 23/3128 |
| | | | | 257/E25.027 |
| 2011/0161583 A1* | 6/2011 | Youn | | G11C 7/02 |
| | | | | 711/E12.001 |
| 2011/0309496 A1* | 12/2011 | Wang | | H01L 23/3121 |
| | | | | 257/737 |
| 2012/0032684 A1* | 2/2012 | Siddiquie | | G01R 31/70 |
| | | | | 324/538 |
| 2012/0064827 A1* | 3/2012 | Kim | | H01L 25/105 |
| | | | | 455/41.1 |
| 2013/0175699 A1* | 7/2013 | Haba | | H01L 24/20 |
| | | | | 257/777 |
| 2013/0241025 A1* | 9/2013 | Pagani | | H01L 24/09 |
| | | | | 438/584 |
| 2014/0131895 A1* | 5/2014 | Song | | G11C 5/04 |
| | | | | 257/777 |
| 2014/0339704 A1* | 11/2014 | Ahn | | H01L 24/02 |
| | | | | 257/773 |
| 2016/0148905 A1* | 5/2016 | Yu | | H01L 25/0657 |
| | | | | 257/48 |
| 2016/0323888 A1 | 11/2016 | Ryu et al. | | |
| 2017/0168746 A1* | 6/2017 | Kwon | | G11C 7/1057 |
| 2017/0220293 A1* | 8/2017 | Kim | | G06F 13/1636 |
| 2017/0309600 A1* | 10/2017 | Jung | | H01L 23/49827 |
| 2018/0095127 A1* | 4/2018 | Pappu | | H03K 19/1776 |
| 2018/0096735 A1* | 4/2018 | Pappu | | G11C 29/70 |
| 2018/0138150 A1* | 5/2018 | Eom | | H01L 24/09 |
| 2019/0371766 A1* | 12/2019 | Liu | | H01L 24/92 |
| 2020/0168527 A1* | 5/2020 | Chang | | H01L 24/17 |
| 2020/0212010 A1* | 7/2020 | Kinsley | | H01L 24/73 |

\* cited by examiner

SEMICONDUCTOR PACKAGES WITH PASS-THROUGH CLOCK TRACES AND ASSOCIATED SYSTEMS AND METHODS

CROSS-REFERENCE TO RELATED APPLICATION(S)

This application is a continuation of U.S. application Ser. No. 16/512,591, filed Jul. 16, 2019; which claims the benefit of U.S. Provisional Patent Application No. 62/787,012, filed Dec. 31, 2018; each of which is incorporated herein by reference in its entirety.

TECHNICAL FIELD

The present disclosure generally relates to semiconductor devices. In particular, the present technology relates to semiconductor devices, including dual die package (DDP) semiconductor packages with pass-through clock traces and associated systems and methods.

BACKGROUND

Microelectronic devices generally have one or more dies (i.e., one or more chips) that include integrated circuitry with a high density of very small components. Typically, dies include an array of bond pads electrically coupled to the integrated circuitry. The bond pads are external electrical contacts through which the supply voltage, signals, etc., are transmitted to and from the integrated circuitry. After dies are formed, they are "packaged" to couple the bond pads to a larger array of electrical terminals that can be more easily coupled to the various power supply lines, signal lines, and ground lines.

BRIEF DESCRIPTION OF THE DRAWINGS

Many aspects of the present disclosure can be better understood with reference to the following drawings. The components in the drawings are not necessarily to scale. Instead, emphasis is placed on illustrating clearly the principles of the present disclosure. The drawings should not be taken to limit the disclosure to the specific embodiments depicted, but are for explanation and understanding only.

DETAILED DESCRIPTION

Figure 1A:
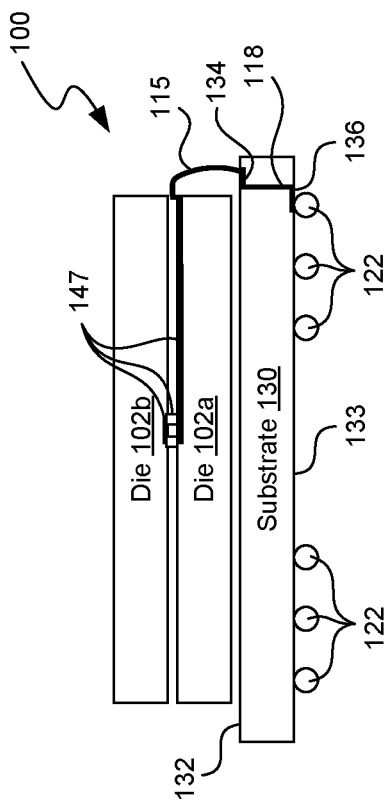
FIGS. 1A and 1B are cross-sectional views illustrating a semiconductor device and an arrangement of semiconductor devices in a dual in-line memory module (DIMM), respectively.

Clock signals are used to coordinate actions of integrated circuitry in microelectronic devices. Double data rate (DDR) is a clock signaling scheme that transfers data on both the rising edge and the falling edge of a clock signal. Data transmission rates and bandwidths have improved in each successive generation of DDR (e.g., DDR, DDR2, DDR3, DDR4, and DDR5) by, for example, increasing the frequency of the clock signal and/or the number of data transfers per clock cycle. As bandwidth increases, however, signal integrity limitations constrain the clock frequency. For example, loading on a clock signal can slow the rise and/or fall of the clock signal, leading to more noise, cross-talk, and/or other errors (e.g., skew errors) as bandwidth increases. These problems can be exacerbated by physically longer clock traces that are used to provide clock signals to multiple dies in a semiconductor device package.

Accordingly, several embodiments of the present technology are directed to semiconductor devices, including DDP semiconductor packages and associated systems and methods, in which pass-through clock traces are provided to overcome the foregoing challenges. In one embodiment, a semiconductor device includes a package substrate including a first surface having a plurality of substrate contacts, a first semiconductor die having a lower surface attached to the first surface of the package substrate, and a second semiconductor die stacked on top of the first semiconductor die. The first semiconductor die includes an upper surface with a first conductive contact, and the second semiconductor die includes a second conductive contact. A first electrical connector and a second electrical connector electrically couple a first one and a second one, respectively, of the plurality of substrate contacts to the first and second conductive contacts. In some embodiments, the first and second ones of the plurality of substrate contacts are disposed adjacent different edges of the first semiconductor die. In these and other embodiments, the semiconductor device is electrically coupled to a printed circuit board (PCB) having a clock trace. The pass-through trace of the semiconductor device can reduce a load placed on a clock signal driven through the PCB and to the first and second semiconductor dies of the semiconductor device, especially compared to branches or stubs electrically coupled to the clock trace in conventional semiconductor devices.

Specific details of several embodiments of the present technology are described herein with reference to FIGS. 1-5B. Although many of the embodiments are described with respect to dual die package (DDP) semiconductor devices and systems with pass-through clock traces, other applications and other embodiments in addition to those described herein are within the scope of the present technology. Further, embodiments of the present technology can have different configurations, components, and/or procedures than those shown or described herein. Moreover, a person of ordinary skill in the art will understand that embodiments of the present technology can have configurations, components, and/or procedures in addition to those shown or described herein and that these and other embodiments can be without several of the configurations, components, and/or procedures shown or described herein without deviating from the present technology.

As used herein, the terms "vertical," "lateral," "upper," "lower," "top," and "bottom" can refer to relative directions or positions of features in the semiconductor devices in view of the orientation shown in the Figures. For example, "upper" or "top" can refer to a feature positioned closer to the top of a page than another feature. These terms, however, should be construed broadly to include semiconductor devices having other orientations, such as inverted or inclined orientations where top/bottom, over/under, above/below, up/down and left/right can be interchanged depending on the orientation.

Figure 1B:
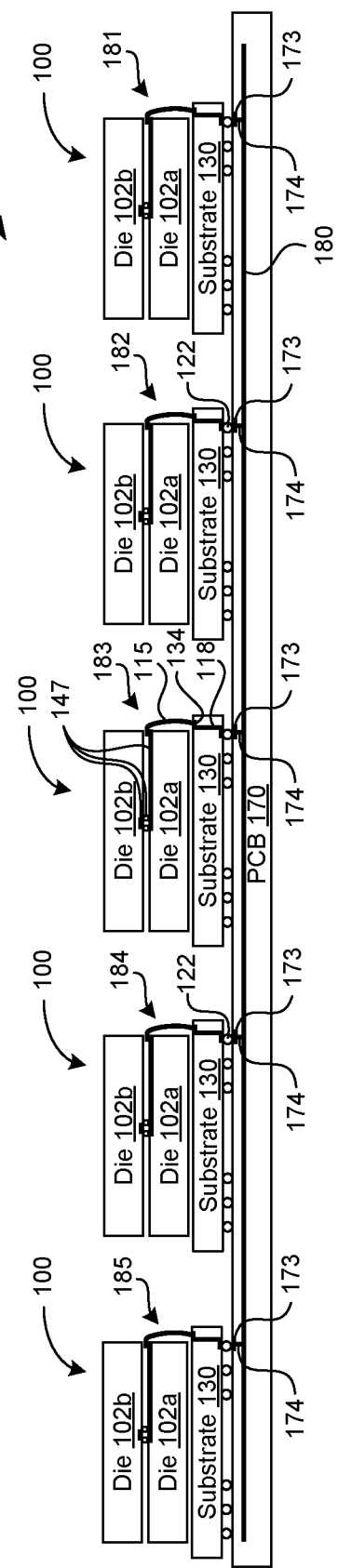

FIGS. 1A and 1B are cross-sectional views illustrating a conventional semiconductor device 100 ("device 100") and a conventional arrangement 1000 of semiconductor devices 100 in a dual in-line memory module (DIMM), respectively. With reference to FIG. 1A, the device 100 includes a package substrate 130, a first semiconductor die 102a attached to the package substrate 130, and a second semiconductor die 102b stacked on top of the first semiconductor die 102a. The first and second semiconductor dies 102a and 102b are electrically coupled to the package substrate 130 via a wire bond 115. In particular, the wire bond 115 electrically couples a first contact 134 (e.g., a bond pad) exposed at a top surface 132 of the package substrate 130 to metallization layers, traces, or other electrical connectors 147 of the semiconductor dies 102a and 102b. As shown in FIG. 1A, the metallization layers, traces, or other electrical connectors 147 include a metallization layer on the first semiconductor die 102a, an electrical contact on the second semiconductor die 102b, and electrical connectors (e.g., solder balls) electrically coupling the metallization layer to the electrical contact.

The package substrate 130 further includes a second contact 136 and a conductive line 118. The conductive line 118 extends through the package substrate 130 and electrically couples the first contact 134 to the second contact 136. Electrical connectors 122 are disposed on a bottom surface 133 of the package substrate 130 and electrically couple the second contacts 136 of the package substrate 130 to external circuitry, such as a printed circuit board 170 ("PCB 170"), as shown in FIG. 1B.

Referring to FIG. 1B, several (e.g., five) semiconductor devices 100 are shown connected to the PCB 170 in a conventional arrangement 1000 via the electrical connectors 122. As shown, the PCB 170 includes a clock trace 180 through which a clock signal is delivered to each of the semiconductor devices 100 connected to the PCB 170. In conventional double data rate fourth-generation (DDR4) dynamic random-access memory (DRAM) DIMM's, there are four such arrangements 1000, with each arrangement 100 using a clock for a total of four clocks.

As shown in FIG. 1B, the clock trace 180 of the arrangement 1000 includes five clock branches or stubs 181-185, where each of the branches or stubs 181-185 corresponds to one of the devices 100 connected to the PCB 170. In particular, each of the branches or stubs 181-185 includes (i) metallization layers, traces, or other electrical connectors 147 of the semiconductor dies 102a and 102b; (ii) a wire bond 115; (iii) a first contact 134 of a package substrate 130; (iv) a conductive line 118 of the package substrate 130; (v) a second contact 136 of the package substrate 130; (vi) an electrical connector 122; (vii) a bond pad 173 of the PCB 170; and/or (viii) a trace 174 extending from the clock trace 180 to a corresponding bond pad 173 of the PCB 170. These branches or stubs 181-185 each place a load on a clock signal sent via the clock trace 180 of the PCB 170 and create signal integrity problems in high-speed data transfer scenarios (e.g., when implementing DDR5). For example, as the lengths of the branches or stubs 181-185 increase, the branches or stubs 181-185 can induce transmission line reflections and degrade the quality of the clock signal. To address these limitations, additional clocks (e.g., a fifth clock per DIMM channel or arrangement) can be added to reduce the load on each clock signal and thereby improve signal integrity. Additionally or alternatively, the clock traces can be rerouted to lessen the length of the branches or stubs 181-185 and/or to eliminate the branches or stubs 181-185 altogether.

Figure 2A:
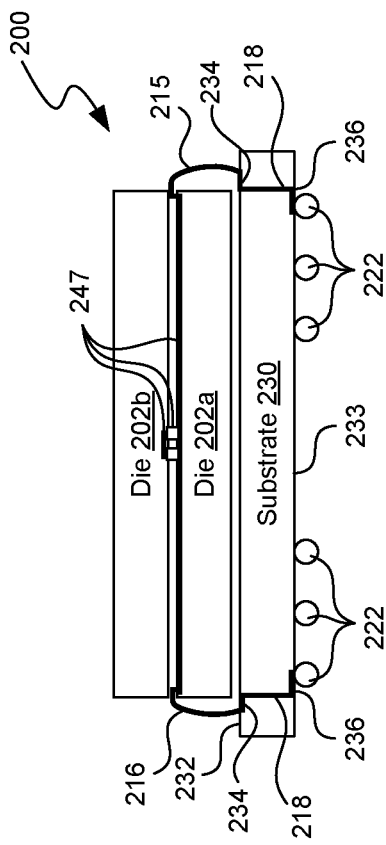
FIGS. 2A and 2B are cross-sectional views illustrating a semiconductor device and an arrangement of semiconductor devices in a dual in-line memory module (DIMM), respectively, configured in accordance with various embodiments of the present technology.
Figure 2B:
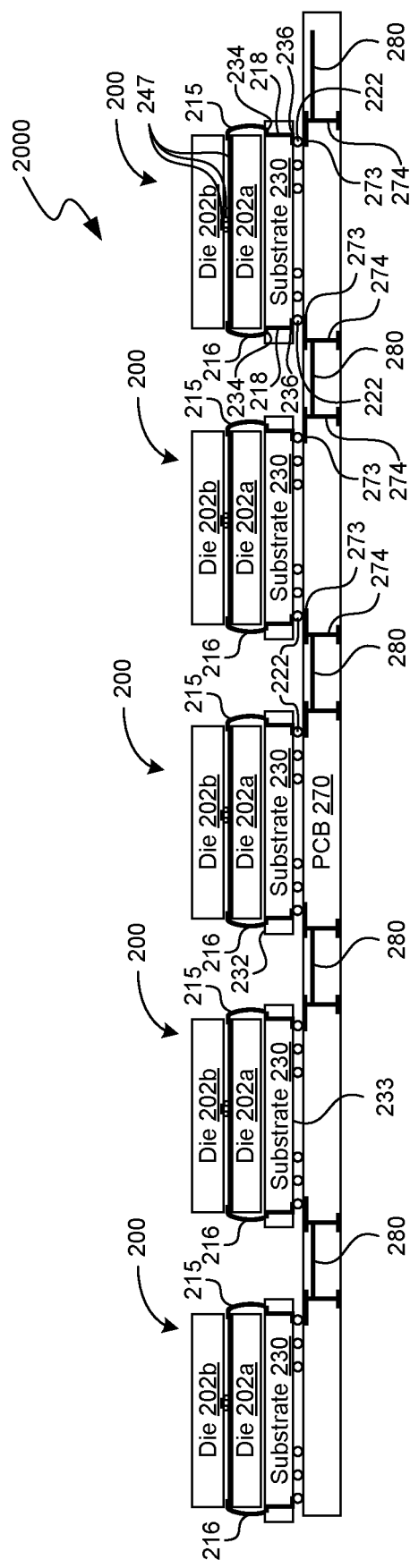

FIGS. 2A and 2B are cross-sectional views illustrating a semiconductor device 200 ("device 200") and an arrangement 2000 of semiconductor devices 200 in a DIMM, respectively, configured in accordance with various embodiments of the present technology. The device 200 illustrated in FIG. 2A is similar to the device 100 illustrated in FIG. 1A in that it includes a package substrate 230, a first semiconductor die 202a attached to the package substrate 230, and a second semiconductor die 202b stacked on top of the first semiconductor die 202a. The package substrate 230 includes (i) first contacts 234 exposed at a top surface 232 of the package substrate 230, (ii) second contacts 236 exposed at a bottom surface 233 of the package substrate 230, and (iii) conductive lines 218 extending through the package substrate 230 and/or electrically coupling the first contacts 234 to corresponding ones of the second contacts 236. A wire bond 215 of the device 200 electrically couples one of the first contacts 234 of the package substrate 230 to metallization layers, traces, and/or other electrical connectors 247 of the semiconductor dies 202a and/or 202b. As shown in FIG. 2A, however, the electrical pathway formed by one of the second contacts 236, one of the conductive lines 218, one of the first contacts 234, the wire bond 215, and the metallization layers, traces, and/or electrical connectors 247 does not terminate at the semiconductor dies 202a and 202b. Instead, the metallization layers, traces, and/or other electrical connectors 247 are also electrically coupled to another of the first contacts 234 of the package substrate 230 via a second wire bond 216. In other words, the device 200 includes a pass-through trace in lieu of the branches or stubs 181-185 of the devices 100 illustrated in FIG. 1B.

Referring to FIG. 2B, several (e.g., five) semiconductor devices 200 are shown connected to a PCB 270 via electrical connectors 222 of the devices 200 to form one arrangement 2000 of a DIMM. The PCB 270 of the arrangement 2000 includes a clock trace 280 through which a clock signal is delivered to each of the semiconductor devices 200 connected to the PCB 270. As shown, the clock trace 280 does not include any branches or stubs. Instead, a clock signal passes back and forth between the clock trace 280 of the PCB 270 and the devices 200 connected to the PCB 270. In particular, a clock signal passes from the clock trace 280 of the PCB 270 to a device 200 connected to the PCB 270 via a trace 274 and/or a bond pad 273 of the PCB 270 and an electrical connector 222 of the device 200 coupled to the bond pad 273. The clock signal is delivered to the semiconductor dies 202a and 202b via the electrical connector 222, a second contact 136 exposed at a bottom surface 233 of the package substrate 230, a conductive line 218 passing through the package substrate 230, a first contact exposed at the top surface 232 of the package substrate 230, the wire bond 215, and/or the metallization layers, traces, and/or other electrical connectors 247 of the semiconductor dies 202a and/or 202b. As discussed above, the clock signal data path does not terminate at the semiconductor dies 202a and/or 202b. Instead, the clock signal returns to the clock trace 280 in the PCB 270 via the metallization layers, traces, and/or other electrical connectors 247, the wire bond 216, a first contact 234 exposed at the top surface 232 of the package substrate 230, a conductive line 218 of the package substrate 230, a second contact 236 exposed at the bottom surface 233 of the package substrate 230, an electrical connector 222 of the device 200, a bond pad 273 of the PCB 270 coupled to the electrical connector 222, and/or a trace 274 electrically coupling the bond pad 273 to the clock trace 280. In this manner, the clock signal can continue to propagate through the arrangement 2000, passing back and forth between the clock trace 280 of the PCB 270 and the devices 200 connected to the PCB 270 until each of the devices 200 has received the clock signal.

Routing of the clock signal as shown in FIG. 2B offers several advantages over conventional clock routing schemes. For example, the clock signal data path through the arrangement 2000 illustrated in FIG. 2B does not include any branches or stubs. Thus, signal line reflections in the clock signal data path are decreased and/or eliminated altogether. As a result, signal integrity of the clock signal is maintained even as data transfer rates are increased. Furthermore, decreasing the lengths of the branches or stubs and/or eliminating the branches or stubs altogether decreases the load placed on a clock signal propagating through the arrangement 2000, obviating the use of more clocks. In this manner, the semiconductor device(s) 200 and the arrangement 2000 illustrated in FIGS. 2A and/or 2B can employ a DDR5 clock signaling scheme using the same number of clocks (e.g., four clocks per DIMM channel or arrangement) that are conventionally used to employ a DDR4 clock signaling scheme.

Although the device(s) 200 illustrated in FIGS. 2A and 2B are dual die packages (DDP), devices configured in accordance with other embodiments of the present technology can include a greater or lesser number of semiconductor dies 202 (e.g., one semiconductor die or more than two semiconductor dies) than illustrated. In these and other embodiments, the number of semiconductor dies in each device of an arrangement in a DIMM can vary. In these and still other embodiments, the orientation of the semiconductor dies included in each device can vary. For example, the semiconductor dies 202a and 202b illustrated in FIGS. 2A and 2B are arranged in a face-to-face orientation. In other embodiments, the semiconductor die 202a can be oriented face down (e.g., toward the package substrate 230) and/or the semiconductor die 202b can be oriented face up (e.g., away from the package substrate 230) such that the semiconductor dies 202a and 202b are arranged in a face-to-back, back-to-face, and/or back-to-back orientation on the package substrate 230.

In some embodiments, other electrical connectors than illustrated in FIGS. 2A and/or 2B can be used to route a clock signal through an arrangement of semiconductor dies in a DIMM. For example, the first die 202a can be oriented face down and attached to the package substrate 230 using a direct contact attachment (DCA). In these and other embodiments, the first die 202a can include one or more through substrate vias (TSV's) (e.g., TSV's 515 and 516 shown in FIGS. 5A and 5B) in lieu of the wire bonds 215 and/or 216. The TSV's can be electrically coupled to electrical contacts on the second die 202b and can be configured to pass a clock signal received at the first die 202a to the second die 202b and/or to return a clock signal received at the second die 202b to the package substrate 230 via the first die 202a. In this manner, the length of the data path can be decreased in comparison to the embodiment illustrated in FIGS. 2A and 2B.

In these and other embodiments, the first die 202a and/or the second die 202b can be configured to redrive a received clock signal to the other of the dies 202a or 202b. For example, the first die 202a can be configured as a master die, and the second die 202b can be configured as a slave die. In these embodiments, a clock signal can be routed to only the first die 202a in a device 200 before returning to the PCB 270 and before continuing on to another device 200 connected to the PCB 270. The first die 202a can then redrive the received clock signal to the second die 202b. In this manner, the load placed on a clock signal can be further reduced in comparison to the embodiments discussed above.

In some embodiments, the first and second dies 202a and 202b can be arranged side-by-side on the package substrate 230. In these embodiments, the first die 202a and/or the second die 202b can be arranged face down or face up on the package substrate 230. The device 200 can include a pass-through trace that is electrically coupled to the first die 202a and/or the second die 202b. For example, the first die 202a and/or the second die 202b can be arranged face down and/or can be attached to the package substrate 230 via a DCA. In these embodiments, a clock signal can pass through the package substrate 230 from a clock trace 280 in the PCB 270 and to each of the dies 202a and 202b before returning to the PCB 270 (e.g., via the package substrate 230). In this manner, the length of the data path of the clock signal can be further decreased in comparison to the embodiments discussed above. In these and other embodiments, a clock signal can pass from a clock trace 280 in the PCB 270 to only one of the dies 202a or 202b before returning to the PCB 270. The die 202a or 202b that received the clock signal can then redrive the clock signal to the other die 202a or 202b (e.g., in a master/slave configuration). In this manner, the length of the data path of the clock signal and the load on the clock signal can be even further decreased in comparison to the embodiments discussed above. In still other master/slave embodiments, the data path of the clock signal can terminate at the one of the dies 202a or 202b such that the clock routing in the semiconductor device forms a branch or stub electrically coupled to the clock trace 280.

Figure 3A:
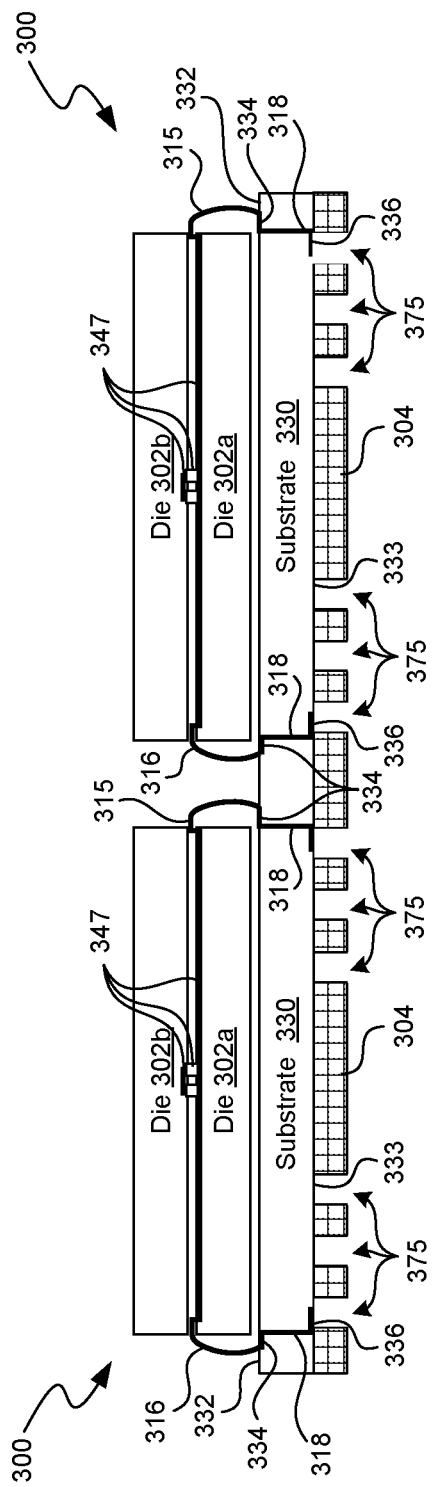
FIGS. 3A-3C are cross-sectional views illustrating a semiconductor device at various stages of manufacturing in accordance with various embodiments of the present technology.
Figure 3B:
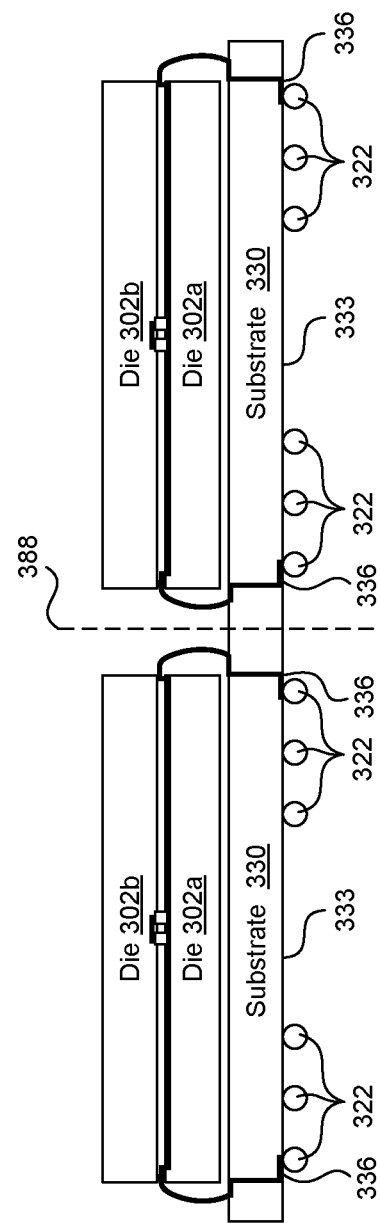
Figure 3C:
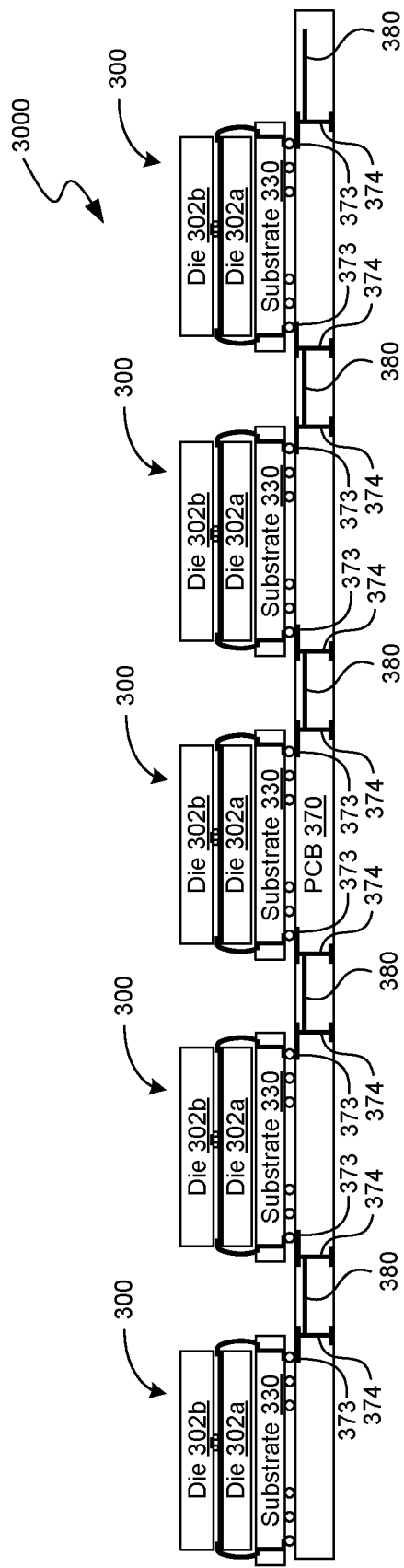

FIGS. 3A-3C are cross-sectional views illustrating a semiconductor device 300 at various stages of manufacturing in accordance with various embodiments of the present technology. Generally, the semiconductor device 300 can be manufactured, for example, as a discrete device or as part of a larger wafer or panel. In wafer-level or panel-level manufacturing, a larger semiconductor device is formed before being singulated to form a plurality of individual devices. For ease of explanation and understanding, FIGS. 3A-3C illustrate the fabrication of two semiconductor devices 300. However, one skilled in the art will readily understand that the fabrication of the semiconductor devices 300 can be scaled to the wafer and/or panel level—that is, to include many more components so as to be capable of being singulated into more than two semiconductor devices 300—while including similar features and using similar processes as described herein.

Fabrication of the semiconductor devices 300 can begin with formation of a package substrate 330. FIG. 3A illustrates the semiconductor devices 300 after the package substrate 330 is fully formed. As shown, first contacts 334 are electrically coupled to conductive lines 318 (e.g., conductive vias and/or traces) extending within, through, and/or on the package substrate 330 to electrically couple individual ones of the first contacts 334 to corresponding ones of second contacts 336. The first contacts 334, the second contacts 336, and/or the conductive lines 318 can be made from copper, nickel, solder (e.g., SnAg-based solder), conductor-filled epoxy, and/or other electrically conductive materials. In some embodiments, the first contacts 334, the second contacts 336, and/or the conductive lines 318 are made from the same material. In other embodiments, the first contacts 334, the second contacts 336, and/or the conductive lines 318 may include more than one conductive material and/or can comprise different conductive materials from one another.

Figure 5A:
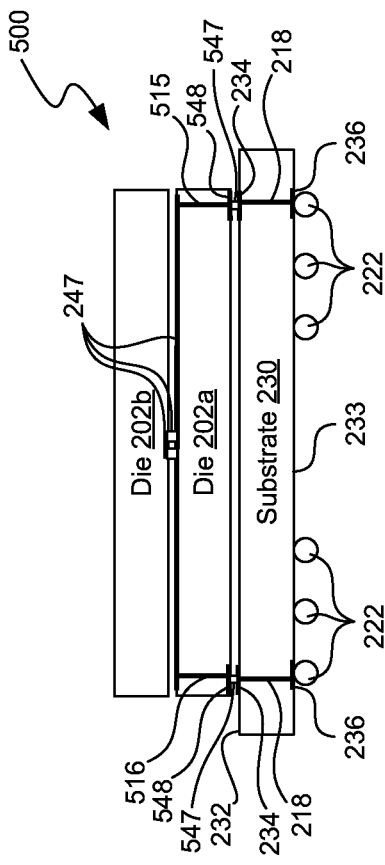
FIGS. 5A and 5B are cross-sectional views illustrating a semiconductor device and an arrangement of semiconductor devices in a DIMM, respectively, configured in accordance with various embodiments of the present technology.
Figure 5B:
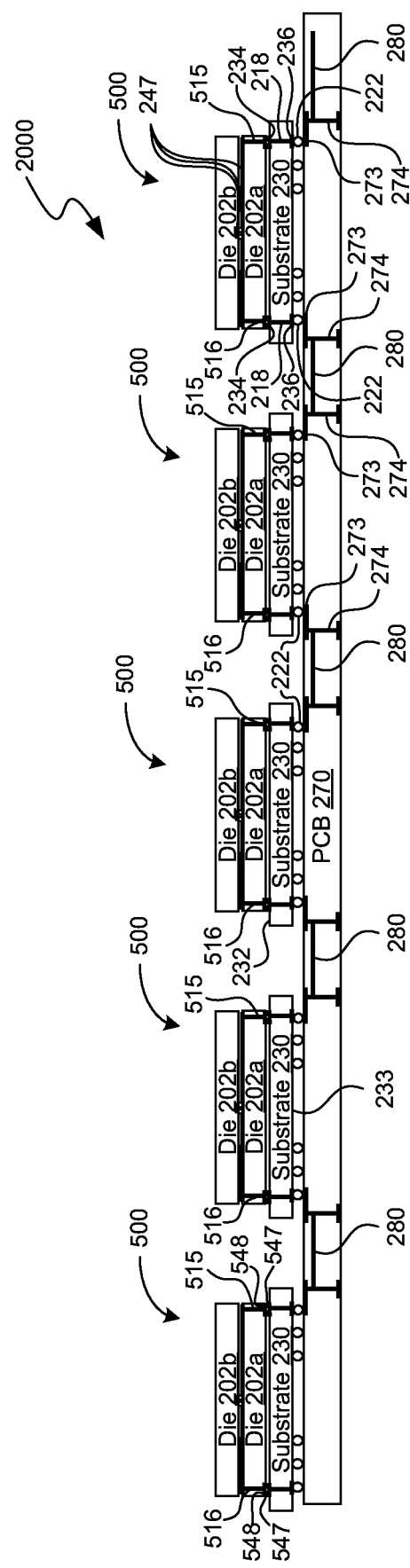

Fabrication of the semiconductor devices 300 continues with coupling one or more semiconductor dies 302a to die-attach areas of the package substrate 330. The semiconductor die(s) 302a can include various types of semiconductor components and functional features, such as dynamic random-access memory (DRAM), static random-access memory (SRAM), flash memory, or other forms of integrated circuit memory, processing circuitry, imaging components, and/or other semiconductor features. A back side of the semiconductor die 302a (e.g., a side opposite a front side or face having metallization layers, exposed traces, and/or other electrical connectors 347, such as bond pads) is attached to a die-attach area at an exposed top surface 332 of the package substrate 330. In FIG. 3A, none of the first contacts 334 are disposed within the die-attach area of the package substrate 330. In other embodiments, one or more of the first contacts 334 can be disposed within the die-attach area under the semiconductor dies 302a (e.g., as shown in FIGS. 5A and 5B, or when one or more of the semiconductor dies 302a are oriented face down on the package substrate 330).

The metallization layers, exposed traces, and/or other electrical connectors 347 of the semiconductor dies 302a are electrically coupled to corresponding first contacts 334 of the package substrate 330 via wire bonds 315 and 316 to form a pass-through trace in each device 300. In other embodiments, the semiconductor devices 300 include other types of electrical connectors, such as one or more through substrate vias (TSV's) (e.g., TSV's 515 and 516; FIGS. 5A and 5B), conductive bumps (e.g., conductive bumps 547 shown in FIGS. 5A and 5B), conductive pillars, conductive lead frames, etc. (e.g., electrical contacts 548 shown in FIGS. 5A and 5B). In these and other embodiments, the semiconductor dies 302a can be positioned face down such that the front side of each semiconductor die 302a faces the package substrate 330.

As shown, one or more additional semiconductor dies 302b can be stacked on the semiconductor dies 302a to form die stacks, and additional electrical connectors 347 can be formed to electrically couple the semiconductor dies 302b to the semiconductor dies 302a and/or to the package substrate 330. For example, the semiconductor dies 302a and the semiconductor dies 302b can be stacked front-to-back, front-to-front, back-to-back, and/or back-to-front on the package substrate 330. Accordingly, a plurality of die stacks can be separated from each other along the package substrate 330. In some embodiments, a die stack can include a different number of semiconductor dies 302 than another die stack. In these and other embodiments, the semiconductor dies 302b can be stacked on the semiconductor dies 302a such that the semiconductor dies 302a are not directly below the semiconductor dies 302b, and/or the semiconductor dies 302b can have different dimensions or orientations from the semiconductor dies 302a. For example, the semiconductor dies 302b can be mounted such that they have a portion that overhangs the semiconductor dies 302a, or the semiconductor dies 302a can be larger than the semiconductor dies 302b such that the semiconductor dies 302b are positioned entirely within a footprint of the semiconductor dies 302a. In other embodiments, the semiconductor dies 302b can be positioned adjacent the semiconductor dies 302a in a side-by-side arrangement on the package substrate 330 and/or can be attached to the package substrate 330 in a manner similar to the semiconductor dies 302a.

In some embodiments, one or more of the second contacts 336 of the package substrate 330 are spaced laterally farther from the semiconductor dies 302a and/or 302b than the corresponding first contacts 334. That is, some of the second contacts 336 can be fanned out or positioned laterally outboard of the corresponding first contacts 334 to which they are electrically coupled. Positioning the second contacts 336 laterally outboard of the first contacts 334 facilitates connection of the devices 300 to other devices and/or interfaces having connections with a greater pitch than that of the semiconductor dies 302a and/or 302b.

In some embodiments, fabrication of the semiconductor devices 300 continues with forming a molded material (not shown) on the top surface 332 of the package substrate 330 and around the semiconductor dies 302a and/or 302b. In some embodiments, the molded material can completely cover the semiconductor dies 302a and/or 302b and the package substrate 330. In these and other embodiments, the molded material encapsulates the semiconductor dies 302a and/or 302b such that the semiconductor dies 302a and/or 302b are sealed within the molded material and are protected from contaminants and physical damage. In some embodiments, the molded material can also encapsulate some or all of the electrical connectors that connect the semiconductor dies 302a and/or 302b to corresponding first contacts 334 of the package substrate 330. The molded material can provide structural strength to the device 300. For example, the molded material can be selected to prevent the devices from warping, bending, etc., as external forces are applied to the devices 300. The molded material may be formed from a resin, epoxy resin, silicone-based material, polyimide, and/or other suitable resin used or known in the art. Once deposited, the molded material can be cured by UV light, chemical hardeners, heat, or other suitable curing methods known in the art.

Fabrication of the semiconductor devices 300 can continue with forming electrical connectors 322 (FIG. 3B) on the second contacts 336 (FIGS. 3A-3B) of the package substrate 330. In this regard, a solder mask 304 can be applied to a bottom surface 333 of the package substrate 330 and etched to form a plurality of openings 375 through the solder mask 304 and/or into the package substrate 330. In some embodiments, the etching can expose the second contacts 336 through the package substrate 330 by removing a portion of the package substrate 330. In other embodiments, the second contacts 336 can be exposed before applying and/or etching the solder mask 304 (e.g., during removal of a carrier substrate (not shown)). Solder and/or conductive epoxy (not shown) can be filled into the plurality of openings 375. For example, a stenciling machine can deposit discrete blocks of solder paste (not shown) onto the second contacts 336 of the package substrate 330.

Referring to FIG. 3B, all or a portion of the solder mask 304 (FIG. 3A) can be removed, and solder and/or conductive epoxy deposited onto the second contacts 336 through the plurality of openings 375 (FIG. 3A) can be used to form electrical connectors 322. For example, deposited solder can be reflowed to form a plurality of solder balls or solder bumps. Alternatively, the deposited solder and/or conductive epoxy can be used to form conductive pillars, conductive lands, and/or other suitable, electrically conductive elements. As discussed above, the electrical connectors 322 are configured to electrically couple the second contacts 336 of the package substrate 330 to external circuitry or components (e.g., a PCB 370; FIG. 3C). In other embodiments, the electrical connectors 322 can be omitted, and the second contacts 336 can be directly connected to external components or circuitry. Fabrication can continue by singulating the semiconductor devices 300. As shown, the package substrate 330 can be cut at a plurality of dicing lanes 388 to separate the semiconductor devices 300 from one another.

Referring to FIG. 3C, once fabrication is completed, the individual semiconductor devices 300 can be attached to external circuity or components via, for example, the electrical connectors 322 and thus incorporated into a myriad of systems and/or devices. As shown in FIG. 3C, for example, one or more (e.g., five) of the devices 300 can be attached to a PCB 370 to form an arrangement 3000 of semiconductor devices 300 in a channel of a dual in-line memory module (DIMM). At least some of the electrical connectors 322 of each of the devices 300 can electrically couple the pass-through trace on each of the devices 300 to a clock trace 380 in the PCB 370 via bond pads 373 and/or other traces 374 in the PCB 370. As a result, a clock signal driven over the clock trace 380 of the PCB can be delivered to each of the devices 300 (e.g., to one or more of the semiconductor dies 302a and/or 302b) in a daisy-chain configuration, thereby eliminating branches or stubs from the clock signal data path and lessening the load placed on the clock signal.

Although the fabrication steps discussed above with respect to FIGS. 3A-3C are discussed and illustrated in a particular order, the fabrication steps are not so limited. In other embodiments, the fabrication steps can be performed in a different order. In these and other embodiments, any of the fabrication steps can be performed before, during, and/or after any of the other fabrication steps. For example, the semiconductor devices 300 can be singulated before the solder mask 304 is applied and/or etched. Furthermore, a person of ordinary skill in the art will readily recognize that the fabrication steps can be altered and still remain within these and other embodiments of the present technology. For example, one or more of the fabrication steps can be omitted and/or repeated in some embodiments. In these and other embodiments, fabrication of the semiconductor devices 300 can include additional fabrication steps. For example, fabrication can include a finishing and/or polishing step (e.g., to remove burrs and/or other unwanted material).

Figure 4:
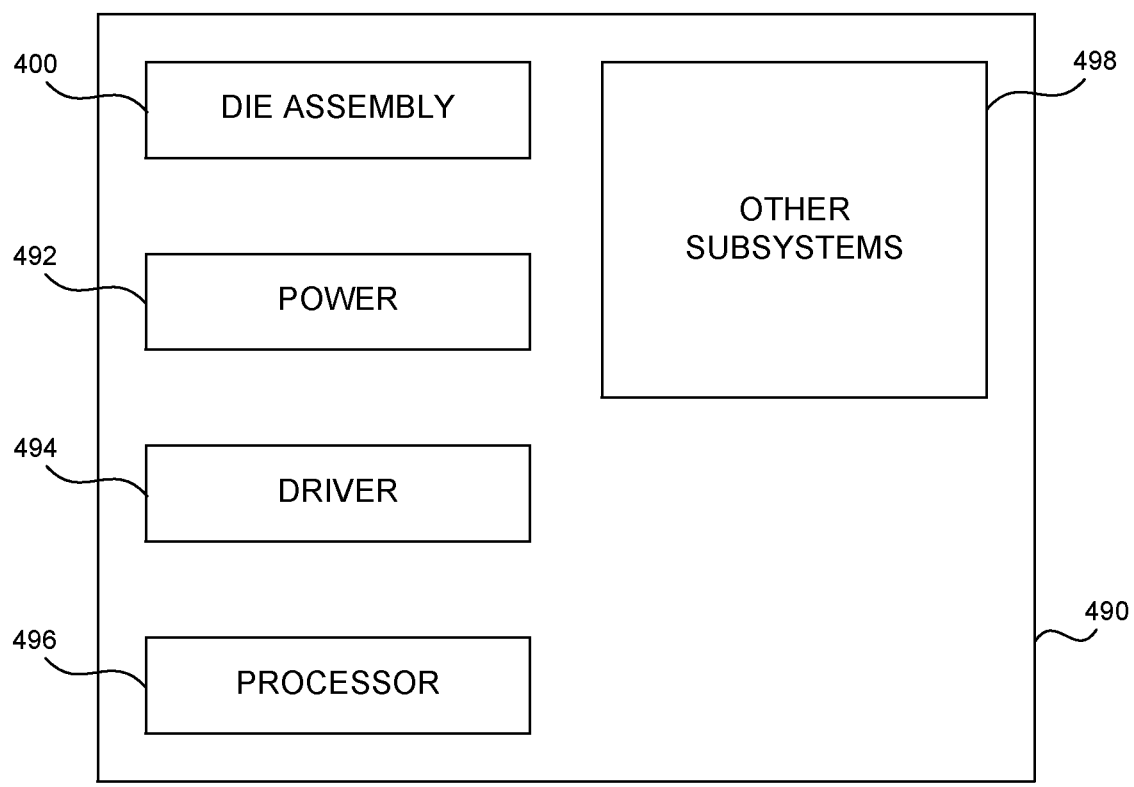
FIG. 4 is a schematic view of a system that includes a semiconductor device configured in accordance with an embodiment of the present technology.

Any one of the semiconductor devices and/or arrangements described above with reference to FIGS. 1A-3C, 5A, and 5B can be incorporated into any of a myriad of larger and/or more complex systems, a representative example of which is system 490 shown schematically in FIG. 4. The system 490 can include a semiconductor die assembly 400, a power source 492, a driver 494, a processor 496, and/or other subsystems or components 498. The semiconductor die assembly 400 can include semiconductor devices with features generally similar to those of the semiconductor devices described above. The resulting system 490 can perform any of a wide variety of functions, such as memory storage, data processing, and/or other suitable functions. Accordingly, representative systems 490 can include, without limitation, hand-held devices (e.g., mobile phones, tablets, digital readers, and digital audio players), computers, and appliances. Components of the system 490 may be housed in a single unit or distributed over multiple, interconnected units (e.g., through a communications network). The components of the system 490 can also include remote devices and any of a wide variety of computer readable media.

Conclusion

The above detailed descriptions of embodiments of the technology are not intended to be exhaustive or to limit the technology to the precise form disclosed above. Although specific embodiments of, and examples for, the technology are described above for illustrative purposes, various equivalent modifications are possible within the scope of the technology, as those skilled in the relevant art will recognize. For example, while steps are presented in a given order, alternative embodiments can perform steps in a different order. Furthermore, the various embodiments described herein can also be combined to provide further embodiments.

From the foregoing, it will be appreciated that specific embodiments of the technology have been described herein for purposes of illustration, but well-known structures and functions have not been shown or described in detail to avoid unnecessarily obscuring the description of the embodiments of the technology. Where the context permits, singular or plural terms can also include the plural or singular term, respectively. Moreover, unless the word "or" is expressly limited to mean only a single item exclusive from the other items in reference to a list of two or more items, then the use of "or" in such a list is to be interpreted as including (a) any single item in the list, (b) all of the items in the list, or (c) any combination of the items in the list. Where the context permits, singular or plural terms can also include the plural or singular term, respectively. Additionally, the terms "comprising," "including," "having" and "with" are used throughout to mean including at least the recited feature(s) such that any greater number of the same feature and/or additional types of other features are not precluded.

From the foregoing, it will also be appreciated that various modifications can be made without deviating from the technology. For example, various components of the technology can be further divided into subcomponents, or that various components and functions of the technology can be combined and/or integrated. Furthermore, although advantages associated with certain embodiments of the technology have been described in the context of those embodiments, other embodiments can also exhibit such advantages, and not all embodiments need necessarily exhibit such advantages to fall within the scope of the technology. Accordingly, the disclosure and associated technology can encompass other embodiments not expressly shown or described herein.

We claim:

1. A semiconductor device, comprising:
a package substrate;
a semiconductor die attached to the package substrate;
a first electrical connector; and
a second electrical connector,
wherein the package substrate is electrically coupled to the semiconductor die via the first electrical connector and via the second electrical connector such that, when a clock signal is transmitted from the package substrate to the semiconductor die via one of the first and second electrical connectors, the clock signal returns to the package substrate via the other of the first and second electrical connectors.

2. The semiconductor device of claim 1, wherein:
the semiconductor die is a first semiconductor die; and
the semiconductor device further comprises a second semiconductor die.

3. The semiconductor device of claim 2, wherein the first semiconductor die is configured to redrive the clock signal received from the package substrate to the second semiconductor die.

4. The semiconductor device of claim 2, wherein the first semiconductor die and the second semiconductor die are arranged in a stacked configuration.

5. The semiconductor device of claim 2, wherein the first semiconductor die and the second semiconductor die are arranged side-by-side on the package substrate or are arranged in separate stacks of semiconductor die over the package substrate.

6. The semiconductor device of claim 2, wherein the package substrate is electrically coupled to the second semiconductor die via the first and second electrical connectors.

7. The semiconductor device of claim 1, wherein at least one of the first and second electrical connectors includes (i) a wire bond or (ii) a through substrate via (TSV) included in the semiconductor die.

8. The semiconductor device of claim 1, further comprising a printed circuit board (PCB) attached to the package substrate, wherein the PCB includes a clock trace electrically coupled to the first and second electrical connectors such that, when the clock signal is transmitted from the clock trace of the PCB to the semiconductor die via the one of the first and second electrical connectors, the clock signal is returned to the clock trace of the PCB via the other of the first and second electrical connectors.

9. A method of manufacturing a semiconductor device, the method comprising:
   forming a package substrate;
   attaching a semiconductor die to the package substrate; and
   electrically coupling the package substrate to the semiconductor die via a first electrical connector and a second electrical connector such that, when a clock signal is transmitted from the package substrate to the semiconductor die via one of the first and second electrical connectors, the clock signal returns to the package substrate via the other of the first and second electrical connectors.

10. The method of claim 9, wherein:
    the semiconductor die is a first semiconductor die; and
    the method further comprises attaching a second semiconductor die to the package substrate.

11. The method of claim 10, further comprising electrically coupling the first semiconductor die to the second semiconductor die such that, when the first semiconductor die receives the clock signal form the package substrate, the first semiconductor die redrives the clock signal to the second semiconductor die.

12. The method of claim 10, further comprising electrically coupling the package substrate to the second semiconductor die via the first and second electrical connectors.

13. The method of claim 9, wherein at least one of the first and second electrical connectors includes (i) a wire bond or (ii) a through substrate via (TSV) included in the semiconductor die.

14. The method of claim 9, further comprising attaching a printed circuit board (PCB) to the package substrate, wherein:
    the PCB includes a clock trace, and
    attaching the PCB to the package substrate includes electrically coupling the clock trace to the first and second electrical connectors such that, when the clock signal is transmitted from the clock trace of the PCB to the semiconductor die via the one of the first and second electrical connectors, the clock signal is returned to the clock trace of the PCB via the other of the first and second electrical connectors.

15. A system, comprising:
    a printed circuit board (PCB), wherein the PCB includes a clock trace; and
    a semiconductor device electrically coupled to the PCB, wherein the semiconductor device includes—
    a package substrate,
    a semiconductor die attached to the package substrate,
    a first electrical connector, and
    a second electrical connector,
    wherein the package substrate is electrically coupled to the semiconductor die via the first electrical connector and via the second electrical connector such that, when a clock signal is transmitted from the package substrate to the semiconductor die via one of the first and second electrical connectors, the clock signal returns to the package substrate via the other of the first and second electrical connectors.

16. The system of claim 15, wherein:
    the semiconductor die is a first semiconductor die;
    the semiconductor device further includes a second semiconductor die; and
    the first semiconductor die is configured to redrive the clock signal received from the package substrate to the second semiconductor die.

17. The system of claim 15, wherein:
    the semiconductor die is a first semiconductor die;
    the semiconductor device further includes a second semiconductor die; and
    the package substrate is electrically coupled to the second semiconductor die via the first and second electrical connectors.

18. The system of claim 15, wherein at least one of the first and second electrical connectors of a semiconductor device of the plurality of semiconductor devices includes (i) a wire bond or (ii) a through substrate via (TSV) included in the first semiconductor die of the semiconductor device.

19. The system of claim 15, wherein the PCB is electrically coupled to the first and second electrical connectors such that, when the clock signal is transmitted from the clock trace of the PCB to the semiconductor die via the one of the first and second electrical connectors, the clock signal is returned to the clock trace of the PCB via the other of the first and second electrical connectors.

20. The system of claim 15, wherein the system is an arrangement of dynamic random-access memory (DRAM) semiconductor devices of a dual in-line memory module (DIMM).

* * * * *